United States Patent [19]

Narabu et al.

[11] Patent Number: 5,086,440
[45] Date of Patent: Feb. 4, 1992

[54] CHARGE COUPLED DEVICE WITH ENHANCED INPUT STRUCTURE

[75] Inventors: Tadakuni Narabu; Tetsuya Kondo; Yasuhito Maki; Katsunori Noguchi, all of Kanagawa, Japan

[73] Assignee: Sony Corporation, Tokyo, Japan

[21] Appl. No.: 509,207

[22] Filed: Apr. 16, 1990

Related U.S. Application Data

[63] Continuation-in-part of Ser. No. 102,432, Sep. 29, 1987, Pat. No. 5,029,189, which is a continuation-in-part of Ser. No. 678,829, Dec. 6, 1984, abandoned.

[30] Foreign Application Priority Data

Apr. 18, 1989 [JP] Japan .................................. 1-98590
Apr. 18, 1989 [JP] Japan .................................. 1-98591

[51] Int. Cl.$^5$ ...................... G11C 19/28; G11C 27/04; H01L 29/78
[52] U.S. Cl. .......................... 377/60; 377/58; 377/59; 377/63; 357/24
[58] Field of Search ...................... 377/58-63; 307/296 R, 297, 491, 494, 353, 607; 357/24 M

[56] References Cited

U.S. PATENT DOCUMENTS 4,156,818  5/1979  Collins et al. .................... 377/60
4,621,369  11/1986  Narabu et al. .................... 377/60
4,771,445  9/1988  Pelgrom et al. .................. 377/60

FOREIGN PATENT DOCUMENTS 0147697  7/1985  European Pat. Off. .
0241084  10/1987  European Pat. Off. .
2604820  4/1988  France .
63-88864  4/1988  Japan .
2197556  5/1988  United Kingdom .

Primary Examiner—Stanley D. Miller
Assistant Examiner—Tai V. Duong
Attorney, Agent, or Firm—Ronald P. Kananen

[57] ABSTRACT

An input structure of CCD comprises a primary register having an input gate and a source region and an automatic biasing system which generates a feedback signal to be fed back to input of the primary register. The output of the automatic biasing system is connected to one of the input gate and the source of the primary register for supplying the feedback signal thereto for adjusting input bias level of the primary register. The other one of the input gate and the source is connected to an information signal input terminal to receive therefrom an information signal to be transferred therethrough.

17 Claims, 3 Drawing Sheets

CHARGE COUPLED DEVICE WITH ENHANCED INPUT STRUCTURE

CROSS REFERENCE TO THE RELATED CO-PENDING APPLICATION

The present invention is a continuation-in-part application of the co-pending U.S. Pat. application Ser. No. 102,432, filed on Sept. 29, 1987 now U.S. Pat. No. 5,029,189, which is, in turn, a continuation-in-part application of U.S. Pat. application Ser. No. 678,829, filed on Dec. 6, 1984, which has been abandoned.

BACKGROUND OF THE INVENTION

1. Field of the Invention

The present invention relates generally to a charge coupled device (CCD). More particularly, the invention relates to an input structure of a CCD which enables direct current reproduction while establishing a coincidence of signal phase at its input and output. The invention also relates to an input structure for a CCD capable of bias level in automatic biasing.

2. Description of the Background Art

Automatic biasing strategy for automatically providing an appropriate bias level, is known technology for CCDs. For example, U.S. Pat. No. 4,625,322, issued on Nov. 25, 1986, to Tukazaki et al. discloses one example of an automatic biasing system for a CCD, which employs a pair of auxiliary registers for adjusting an input bias level for a primary or a main register automatically by feeding back the output of the auxiliary registers to an input of the primary register. Similar technology for automatic adjustment of the input bias level has been disclosed in U.S. Pat. No. 4,139,784 issued on Feb. 13, 1979, to Sauer. Also, European Patent First Publication 01 47 697 published on July 10, 1985 discloses a similar structure for a CCD with automatic biasing.

In these prior proposed automatic biasing systems, the output of the auxiliary register is fed back to an input gate of the primary register, to which an information signal to be transferred through the primary register is supplied. In such CCD, it sometimes becomes necessary to add an inverting amplifier between an information signal input terminal and the input gate. In such case, it becomes necessary to provide a capacity for cutting direct current. Namely, when the information signal is supplied to the input gate of the primary register, good linearity can be obtained. On the other hand, the phase of the output signal of the register becomes inverted from that supplied to the input gate. However, coincidence of phases in the input and output signals tends to be required. In such case, the inverting amplifier becomes necessary to be added. The inverting amplifier can be provided either at the input side of the input gate or at the output side of the output circuit. In case that the inverting amplifier is provided at the output side of the output circuit, a wide dynamic range is required since the inverting amplifier has to invert the signal already amplified by the output circuit. This also requires a complicated circuit construction and thus causes difficulty in designing the circuit. These matters will prevent lowering of cost and reduction of chip size. Therefore, it is easier to provide the inverting amplifier at the input side of the input gate. This causes difficulty in reproduction of the direct current level when automatic biasing technology is introduced. Therefore, it becomes necessary to provide a relatively large capacitor on an order of $\mu F$'s. Such large capacity may make it difficult to form the capacitor on the IC chip of a CCD.

On the other hand, for such CCD, it sometimes becomes necessary to vary the input bias level. For instance, in case of the video signal delay element, the bias levels for the positive phase video signal and negative phase video signal are significantly different from each other. Therefore, it is preferred to switch the bias level in the automatic biasing system. For achieving this, it is one approach to provide a plurality of automatic biasing circuits and selecting one to provide a variable bias level. However, this clearly requires a wide area on the chip and requires complicated wiring.

SUMMARY OF THE INVENTION

Therefore, it is an object of the present invention to provide an input structure for a CCD which can separate an input bias system and a signal input system for enabling direct current reproduction without using a large capacity capacitor.

In order to accomplish the aforementioned and other objects, an input structure of a CCD, according to the present invention, comprises a primary register having an input gate and a source region and an automatic biasing system which generates a feedback signal to be fed back to input of the primary register. The output of the automatic biasing system is connected to one of the input gate and the source of the primary register for supplying the feedback signal thereto for adjusting an input bias level of the primary register. The other one of the input gate and the source is connected to an information signal input terminal to receive therefrom an information signal to be transferred therethrough.

According to one aspect of the invention, a charge coupled device with automatic adjustment of an input bias, comprises:

a signal register adapted to transfer an input electric charge, the signal register having first and second mutually separated signal inputs;

a first reference register adapted to transfer electric charges from its input section to its output section, the first reference register having a first maximum charge rating, the input section having third and fourth mutually separated signal inputs, the third signal input being connected to a constant voltage source;

a second reference register constantly supplied with a voltage substantially corresponding to a second maximum charge rating of the second reference register, the second maximum charge rating being a given fraction of the first maximum charge rating;

an information signal source connected to the first signal input of the signal register and the third signal input of the first reference register; and a feedback circuit comparing a first charge transferred through the first reference register and a second charge transferred through the second reference register, deriving a feedback signal having a value corresponding to the difference between the first and second charges, and feedback controlling an input bias on the first reference register to the given fraction of the first maximum charge rating, thereby feedback controlling the input bias on the signal register to substantially the same charge level as that on the first reference register.

The first and third signal inputs comprise input gates and the second and fourth signal inputs comprise source regions, or, in the alternative, the first and third signal inputs comprise source regions and the second and fourth signal inputs comprise input gates.

The signal register may have an input section of substantially the same structure as the input section of the first reference register. Also, the second reference register has an output section of substantially the same structure as the output section of the first reference register. The second reference register may have an input section of substantially the same structure as the input section of the first reference register except that the input section of the reference register has a narrower channel than the input section of the first reference register, which narrower channel defines the second maximum charge rating. The signal register and the first and second reference registers may have charge transfer channels oriented in a parallel relationship to each other and share a common substrate and at least one common transfer electrode.

In the preferred construction, the second reference register has first and second input sections having mutually different handling charge and an output section common to the first and second input sections, the first and second input sections being adapted to selectively transfer charge. In such case, the charge coupled device may further comprise means for selectively supplying a predetermined magnitude of voltage signal to one of the first and second input sections for input sections.

BRIEF DESCRIPTION OF THE DRAWINGS

The present invention will be understood more fully from the detailed description given herebelow and from the accompanying drawings of the preferred embodiments of the present invention, which, however should not be taken to limit the invention to the specific embodiments but are for explanation and understanding only.

In the drawings.

DESCRIPTION OF THE PREFERRED EMBODIMENT

Figure 1:
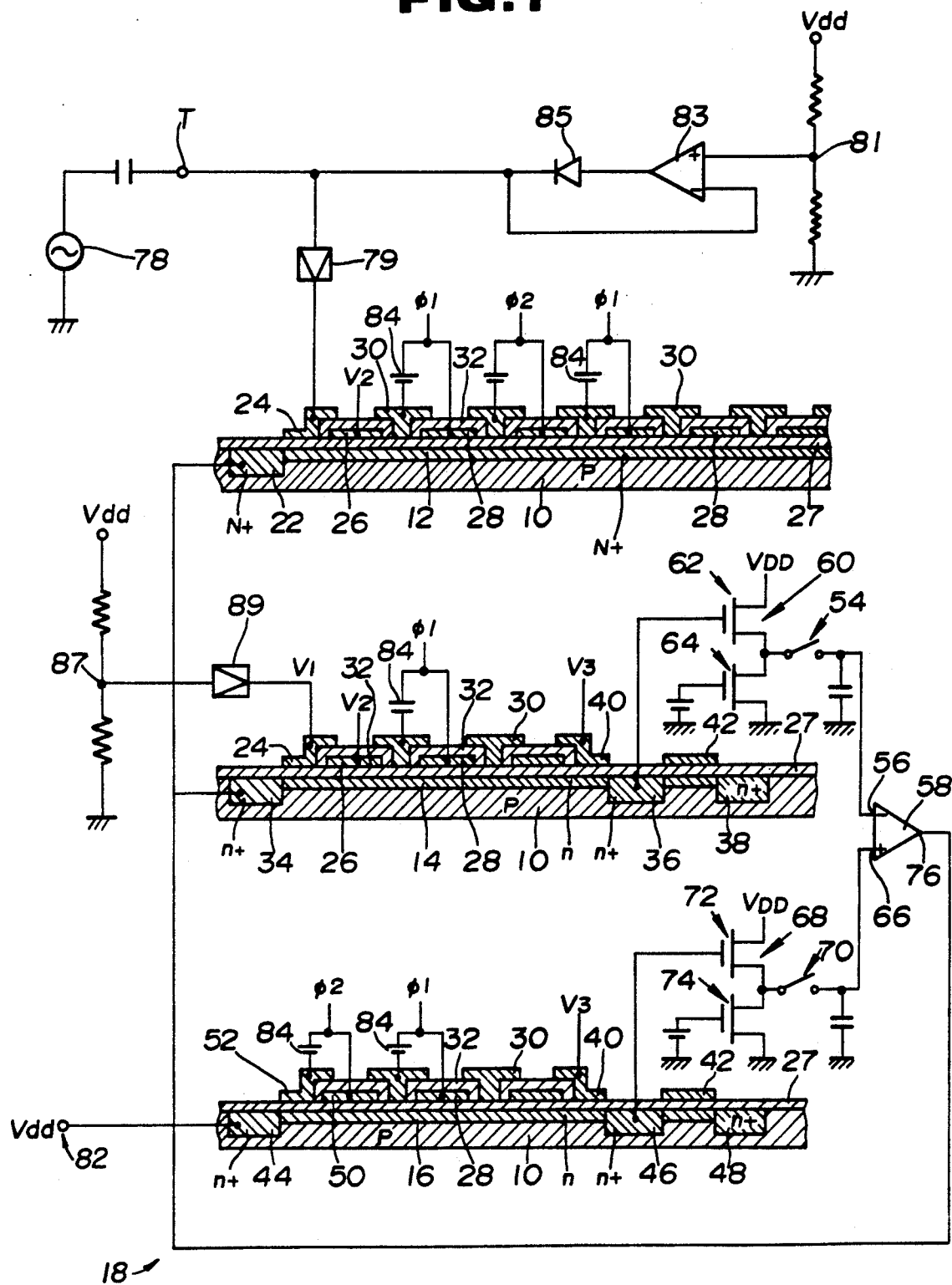
FIG. 1 is a diagram of the first embodiment of CCD according to the present invention.
Figure 2:
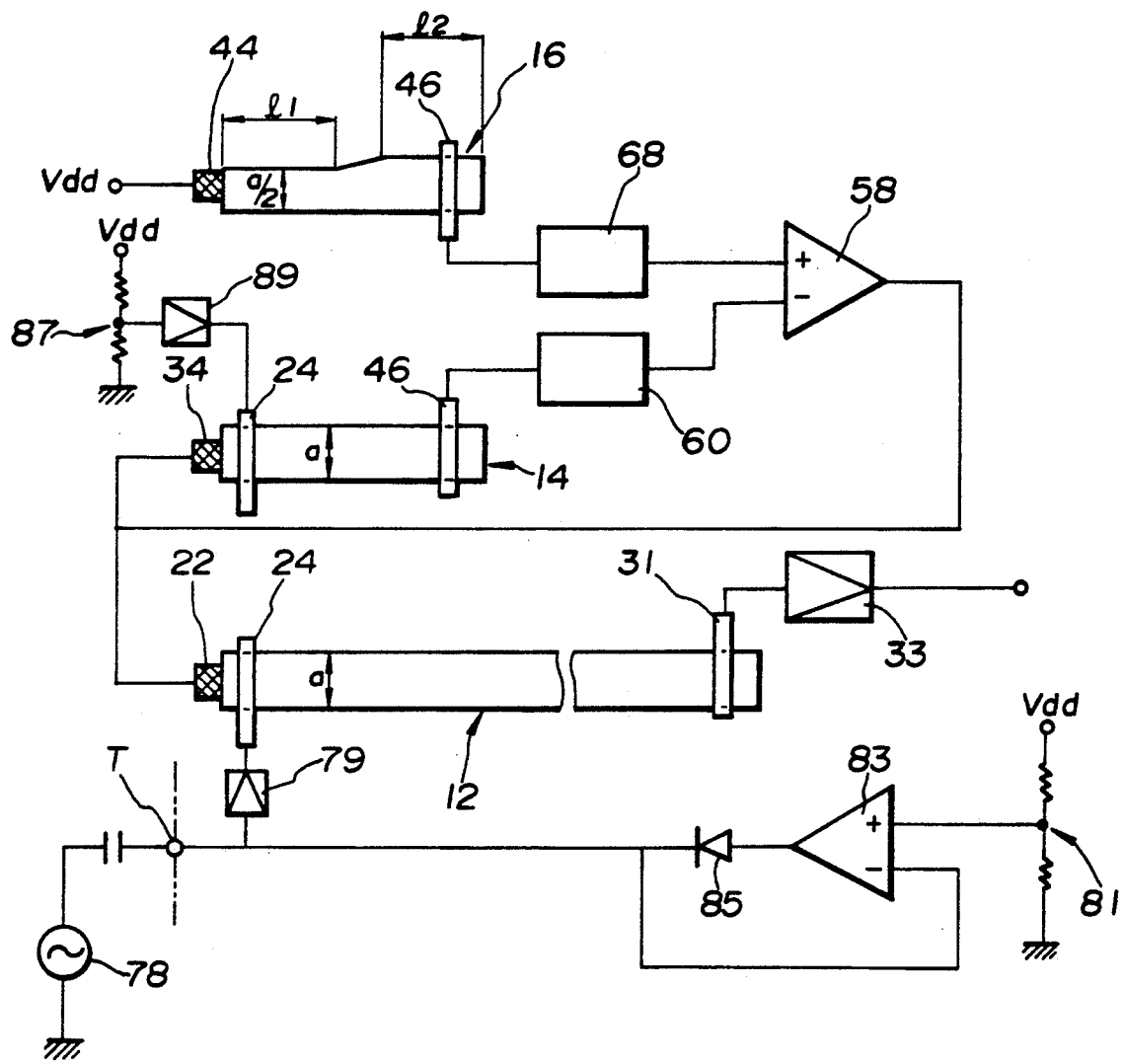
FIG. 2 is a diagrammatic cross section of the first embodiment of the CCD of FIG. 1.

Referring now to the drawings, FIGS. 1 and 2 illustrate the first embodiment of a charge coupled device (CCD) of the present invention in terms of a CCD delay line employing a two-phase, buried-channel device with two-level, n-channel gate electrodes. The CCD has a P-type silicon substrate 10 common to a CCD delaying signal register 12, a first reference register 14 and a second reference register 16. The signal register 12 has a channel width a and a desired number of gates. The first reference register 14 has substantially the same channel width a as the signal register 12 and a predetermined channel length $\lambda$. The second reference register 16 has substantially the same channel length $\lambda$ as the first reference register 14. The input end section 18 of the second reference register 16 has a channel width $a/2$ which is only half that of the first reference register 14 and a predetermined channel length $\lambda_1$. The output end section 20 of the second reference register 16 has the same channel width as the other two registers 12, 14 and a predetermined channel length $\lambda_2$. The input and output end channels of the register 16 are joined by a section of tapering width. The channels of registers 12, 14 and 16 are ribbons of N-type doped silicon sandwitched between the P-type silicon substrate 10 and an insulating layer 27 of silicon dioxide. The first and second reference registers 14 and 16 form an automatic bias system which serves for generating a feedback signal for automatically adjusting a bias level of the signal register 12.

It should be appreciated that although a specific CCD has been illustrated to facilitate discussion of the present invention in detail, the invention can be employed in various types of CCD systems; for example, as is well-known, CCD's can be of either a surface-channel or buried-channel type and can be driven by any of a number of control signal phasing schemes. It should also be appreciated that other electrode structures, such as single-layer or triple-layer, may be employed, and metal and polycrystalline silicon electrodes may be employed.

The signal register 12 has a source region 22 which comprises an N+ diffusion in the P-type silicon substrate 10. The signal register 12 also has first and second input polycrystalline silicon gate electrodes 24 and 26 deposited on the insulating layer 27 and mutually insulated by an interleaved insulating layer 32 of silicon dioxide. The signal register 12 also has a plurality of first-level electrodes 28 and a plurality of second-level electrodes 30 all of polycrystalline silicon and mutually insulated by $SiO_2$ layers 32. The signal register 12 also has an output gate 31 for outputting information signal through an amplifier 33, as shown in FIG. 2.

The first and second input gate electrodes 24 and 26 extend over the channel of the first reference register 14 so that they also serve as input gate electrodes for the latter. The first- and second-level electrodes 28 and 30 extend over both the first and second reference registers 14 and 16 to serve in pairs as shift-staging electrodes for each.

The first reference register 14 has a source region 34 which is similar to that in the signal register 12 and comprises an N+ diffusion in the P-type silicon substrate 10. The first reference register 14 also has a N+ floating diffusion region 36 and another N+ diffusion region used as a pre-charge drain region 38 following the floating diffusion region 36 but separated from the latter by a short stretch of channel. The first reference register 14 also has an output gate 40 and 42, both of polycrystalline silicon deposited on the $SiO_2$ insulator 27. The output gate 40 and the pre-charge gate 42 also extend over the second reference register 16 so as to serve as output gate and the pre-charge gate for the latter.

The second reference register 16 also has a source region 44 comprising an N+ diffusion region in the P-type silicon substrate 10. The source region 44 is similar geometrically to the source regions of the signal register 12 and the first reference register 14. The second reference register 16 also has a N+ floating diffusion region 46 which is similar to the floating diffusion region 36 in the first reference register 14. A pre-charge drain region 48 in the second reference register 16 is similar to the pre-charge drain region 38 in the first register 14 and is similarly separated from the floating diffusion region 46 by a short section of channel. First-level and second-level transfer electrodes 50 and 52 are also formed on the third register 16. The first-level and second-level transfer electrodes 50 and 52, made of polycrystalline silicon, are located at positions corresponding to the first and second input gate electrodes 24 and 26 of the signal register 12 and the first reference register 14.

The operating states of two switches 54 and 70 control the charge on the floating diffusion regions 36 and 46 respectively. The pre-charge drain regions 38 and 48 serve to drain the charge floating diffusion regions 36 and 46 respectively at a timing in synchronism with operation of the switches 54 and 70. For instance, electric charge at the potential in the floating diffusion regions 36 and 46 are reset to $+V_{DD}$ as constantly applied to the pre-charge drain region 38 and 48 when a resetting clock is applied to the pre-charge gate 42. The resetting clock to be applied to the pre-charge gate 42 is adapted to be produced at a timing synchronized with opening of the switches 54 and 70 a given substantially short delay. By transferring the charge or potential to the pre-charge drain regions 38 and 48, the potential in the floating diffusion regions 36 and 46 is reset to $+V_{DD}$.

The floating diffusion region 36 is connected to the inverting input terminal 56 of a differential amplifier 58 via a source follower amplifier 60 and a switch 54. The source follower amplifier 60 comprises two source-drain-connected MOS FET's 62 and 64. Though the switch 54 is represented by a manual-throw switch symbol in the drawings, it may also be embodied as a MOS FET. Similarly, the second floating diffusion region 46 is also connected to the positive or non-inverting input terminal 66 of the differential amplifier 58 via a source follower 68 and a switch 70. As in the source follower 60, the source follower 68 comprises MOS FET 72 and 74. Again, the symbolically illustrated switch 70 will in practice be embodied as a MOS FET.

The switch ON-timing of the switches 54 and 70 is controlled by a sort of sample/hold signal to pass the voltage corresponding to the transferred charge through the first and second registers 14 and 16. The sample/hold signal may be provided with a duty cycle for controlling the switch ON-timing in synchronizm with a transfer of the charge through the registers 14 and 16. Therefore, the signalling timing would be synchronized with the signalling timing of the clocks $\phi_1$ and $\phi_2$.

[The output terminal 76 of the differential amplifier 58 is connected directly to the source region 34 of the first reference register 14 and to the source region 22 of the signal register 12 via a resistor 77. On the other hand, the first input gate 24 is connected to a signal source 78 which provides information signal to be transferred, via a signal input terminal T and an inverting amplifier 79. Also, a clamp level setting voltage divider circuit 81 is connected to the first input gate 24 via a voltage follower which comprises a differential amplifier 83 and a diode 85, and the inverting amplifier 79. The source region 34 of the first reference register 14 is connected to the differential amplifier 58 to receive the feedback signal therefrom. On the other hand, the input gate 24 of the first reference register 14 is connected to a clamp level setting voltage divider circuit 87 via a dummy inverting amplifier 89.

It should be appreciated that the source followers 60 and 68, switches 54 and 70, and the differential amplifier 58 may be formed on the same chip as the registers 10, 14 and 16.

The operation of the CCD described above will be explained in detail. In the following description of the operation, the DC bias applied to the signal register 12 is assumed to be at the midpoint of the dynamic range of the signal register 12.

As shown in FIGS. 1 and 2, a power source 82 is connected to the source region 44 of the second reference register 16 The power source 82 is rated so as to keep the source region 44 saturated with electric charge in other words, to keep its potential well full of a charge carrier. The first-level electrodes 28 and 50 cooperate with the adjacent second-level electrodes 30 and 52 to drive electric charges from potential well to potential well along the buried channels. The direction of transfer of each electric charge packet is determined by the potential difference between adjacent potential wells which in turn is determined by the voltage levels of the two-phase clock signals ($\phi_1$, $\phi_2$) coupled to a battery 84 as well as other operating signals described later. That is, electric charge packets migrate among the asymmetrical potential wells at the various gates and electrodes until they find the local potential minima or voltage maxima.

Each electric charge thus transferred through the second reference register 16 and output through the floating diffusion region 46 is converted into a corresponding voltage by the source follower 68. The converted voltage is sample-held by the switch 70. The switch 70 thus supplies a voltage corresponding to the maximum charge rating of the second reference register 16 to the positive input terminal 66 of the differential amplifier 58. Since the source region 44 of the second reference register 16 is always saturated, the voltage applied to the positive input terminal 66 of the differential amplifier 58 constantly corresponds to the full rating of the second reference register 16.

Upon starting the CCD, the input voltage at the negative input terminal 56 of the differential amplifier 58 is zero, since there is no electric charge transferred to the floating diffusion region 36 of the first reference register 14. At this time, since a voltage corresponding to the maximum charge rating of the second reference register 16 is applied to the positive input terminal, the output voltage of the differential amplifier 58 corresponds to the maximum charge rating of the second reference register 16. The output voltage of the differential amplifier 58 serves as a feedback voltage for the first reference register 14. The feedback voltage from the differential amplifier 58 increases the "depth" of the potential well at the source region 34 of the first reference register 14 by an amount corresponding to the feedback voltage, which, in turn, corresponds to the full rated charge of the second reference register 16.

When predetermined sampling pulse voltages $V_1$ and $V_2$ are applied to the input gate electrodes 24 and 26, an electric charge corresponding to the feedback voltage is transferred to the first-level and second-level transfer electrodes 28 and 30 from the source region 34. Subsequently, repeated application of the clock pulse voltages $\phi_1$ and $\phi_2$ to the first-level and second-level transfer electrodes 28 and 30 drives the electric charge packets to the floating diffusion region 36 via the transfer electrodes. The electric charge transferred to the floating diffusion region is converted into a voltage by the source follower 60. The switch 54 then performs sample/holding of the converted voltage. The voltage obtained by sample/holding is applied to the negative input terminal 56 of the differential amplifier 58.

Since the second reference register 16 has the first-level and second-level transfer electrodes 28 and 30 and the output gate electrode 40 in common to the first reference register 14, charge transfer is performed in the second reference register 16 at substantially the same timing as in the first reference register 14. As set forth above, the charge applied to the source region 44 of the second reference register 16 corresponds to its maximum charge rating. Therefore, when charge corresponding to the depth of the potential well in the source region 34 of the first reference register 14 is transferred to the floating diffusion 36, the charge corresponding to the maximum charge rating of the second reference register 16 is transferred to the floating diffusion region 46 of the second reference register 16. Source followers 60 and 68 operate concurrently to convert the charge in the floating diffusion regions 36 and 46 into voltages. The switches 54 and 70 also operate concurrently. As a result, voltage corresponding to the maximum charge rating of the second reference register 16 is applied to the positive input terminal 66 of the differential amplifier 58 simultaneously with the voltage from the switch 54.

The differential amplifier 58 outputs through its output terminal 76 a voltage corresponding to the difference between the input voltages. The output voltage of the differential amplifier 58 is fed back to the source region 34 of the first reference register 14. The feedback voltage from the differential amplifier 58 adjusts the depth of the potential well of the source region 34, specifically such that the difference between the input voltages of the differential amplifier 58 is reduced to zero. As a result, the charge transferred through the first reference register 14 is held as close as possible to the full charge transferred through the second reference register 16.

In other words, this feedback control causes the charge transferred through the first reference register 14 to match the charge output by the second reference register 16, i.e., the maximum charge rating of the second reference register 16.

As set forth above, the width of the input end section 18 of the second reference register 16 is half that of the first reference register 14, and thus the maximum charge rating of the first reference register 14 is twice that of the second reference register 16. Since the charge transferred through the first reference register 14 is feedback controlled to correspond to the maximum handling charge of the second reference register, the first reference register 14 handles half ($\frac{1}{2}$) of its maximum charge rating. In other words, the first reference register 14 operates under a bias of $\frac{1}{2}$ of its maximum charge rating. Also, as set forth above, the first reference register 14 has the same channel width a as the signal register 12 and the structure of the source region 34 matched that of the source region 22 of the signal register 12. Therefore, the signal register 12 has substantially the same input structure as the first reference register 14. As a result, the bias condition of the signal register 12 will always be substantially equal to that of the first reference register 14. In other words, the bias on the signal register 12 substantially corresponds to $\frac{1}{2}$ of the maximum charge rating of the first reference register 14. On the other hand, the information signal supplied from the signal source 78 is input to the first input gate 24. Therefore, the signal register 12 will operate at the center of its dynamic range which is especially advantageous when the input from the signal source 78 is in the form of a sine-wave.

According to the above embodiment, due to the effect of the differential amplifier and the feedback control of the depth of the potential well of the first reference register 14, the DC bias on the signal register 12 can be automatically controlled to the center half of its dynamic range. Therefore, according to the shown embodiment, it is no longer necessary to employ a conventional amplitude control for adjustment of the DC bias on the signal register, Furthermore, it is also unnecessary to manually adjust the DC bias on the signal register 14, as the DC bias can be automatically controlled. In addition, since the first reference register 14 has substantially the same input structure as the signal register 12 and has substantially the same output structure as that of the second reference register 16, the input section of the first reference register 14 will be influenced by the same temperature variation as that subjected to the input section of the signal register 12. On the other hand the output section of the first register 14 will be subject to the influences of the same temperature variations as the output section of the second output register 16. As a result, the bias on the first reference register 14 can be maintained accurately at one-half rating. Thus, the DC input bias on the signal register 12 can be constantly maintained at one half the maximum charge rating irrespective of temperature variations.

Furthermore, since the shown embodiment separates input of the feedback signal and the information signal respectively to the input gate and the source region, the shown embodiment enables direct current level reproduction and automatic bias control without requiring large capacity capacitor.

In order to fabricate the input end section of the second reference register 16 at a channel width of precisely $\frac{1}{2}$ the width a of the first reference register 14 and the signal register 12 in order to obtain a DC input bias corresponding to $\frac{1}{2}$ its maximum charge rating, the photo-mask pattern used during the exposure process in the semi-conductor IC fabrication process should be designed to have an input channel of the proper width. According to the present invention, the DC bias level can be set with very high accuracy simply by proper design of the photo-mask pattern. This production process also ensures good reproducibility.

Furthermore, in accordance with the shown embodiment, since the channels of the signal register 12, the first reference register 14, and the second reference register 16 are aligned in parallel to each other, the first-level transfer electrodes 28 and the second-level transfer electrodes 30 can be conveniently formed in common to all three registers 12, 14 and 16. Additionally, this allows the first and second input electrodes 24 and 26 of the signal register 12 and the first reference register 14 to be conveniently formed in common. Similarly, the output gate electrode 40 and the pre-charge gate 42 of the first and second reference register 14 and 16 can be formed in common.

Although the aforementioned preferred embodiment has been directed to a CCD with a signal register DC input bias set in the center of its dynamic range the invention is not limited to this specific level, but rather can be selected to be any arbitrary value. It is only necessary to elect the width of the second reference register in relation to the width of the first reference register to obtain the desired level of DC input bias. For instance, if a DC input bias lying at $\frac{3}{4}$ of the maximum charge rating or of the dynamic range is preferred, then the width of the input end section 18 of the second reference register 16 should be $3a/4$, where a is the channel width of the first reference register 14 and the signal register 12. In this case, the input bias will be clamped at the voltage level of ¾ of the dynamic range of the signal register.

In the aforementioned embodiment, the charges transferred through the first and second reference registers 14 and 16 are output to the source followers 60 and 68 through the floating diffusions 36 and 46 and then input to the input terminals 56 and 66 of the differential amplifier 58.

Figure 3:
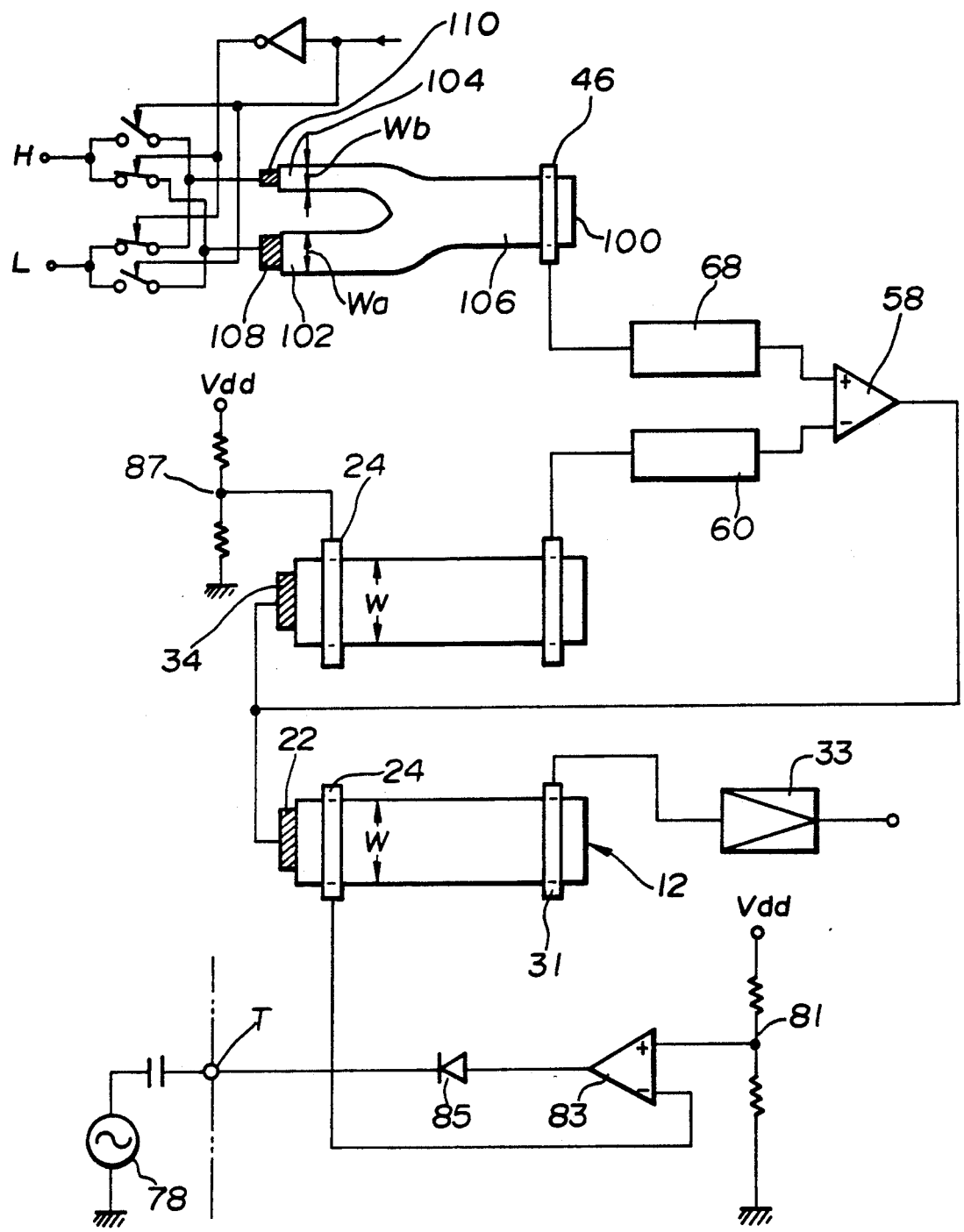
FIG. 3 is a diagram of the second embodiment of CCD according to the present invention.

FIG. 3 shows the second embodiment of CCD according to the present invention. In this embodiment, bias level selecting capability is provided in addition to the former embodiment. Therefore, it should be appreciated that except for the input structure and construction of the second reference register, the shown embodiment has substantially the same construction as that in the former embodiment. Therefore, the common element to the former embodiment will be hereafter represented by the same reference numerals and the detailed discussion is avoided. In other words, the following discussion will be concentrated on the particular features of the shown embodiment.

As can be seen from FIG. 3, a second reference register 100 has a first and second input sections 102 and 104. The first and second input sections 102 and 104 are connected to common output section 106 having the identical construction to that of the first reference register 14. The widths Wa and Wb of the first and second input sections 102 and 104 are selected to define the maximum handling charge of the second reference register. The first and second input sections 102 and 104 has respective source regions 108 and 110 connected to a HIGH level voltage source H and a LOW level voltage source L via a bias level switching circuit 112 which is responsive to a switching signal to selectively supply HIGH level voltage (e.g. 9V) and LOW level voltage (e.g. 5V) to one of the first and second input sections 102 and 104 of the second reference register 100.

In the shown embodiment, when the HIGH level voltage is applied to the source region, charge injection will not be caused and when the LOW level voltage is applied to the source region, charge can be injected. Therefore, by selectively applying HIGH and LOW voltages to the source regions 108 and 110 of the first and second input sections, charge can be selectively transferred through one of the input section. Since the widths of the input sections 102 and 104 are differentiated to each other, bias points with respect to the dynamic range can be varied.

The shown embodiment can achieves the advantage which is achieved by the first embodiment by separating the input of the information signal and the feedback signal. In addition, the shown embodiment permits variation of the bias level of the signal register without causing degradation of performance of CCD or causing complexity of the CCD construction.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A charge coupled device with automatic adjustment of an input bias, comprising:
   a signal register means adapted to transfer input electric charge, said signal register means having first and second mutually separated signal inputs;
   a first reference register means adapted to transfer electric charges from its input section to its output section, said first reference register means having a first maximum charge amount, said input section having third and fourth mutually separated signal inputs, said third signal input connecting to a constant voltage source, said fourth signal input connected to said second signal input of said signal register means;
   a second reference register means constantly supplied with a voltage substantially corresponding to a second maximum charge rating of said second reference register means, said second maximum charge amount being a given fraction of said first maximum charge amount;
   an information signal source connected to said first signal input of said signal register; and
   a feedback circuit means, having its output connected to said second and said fourth signal inputs, for comparing a first charge transferred through said first reference register means and a second charge transferred through said second reference register means, deriving a feedback signal at its said output having a value corresponding to the difference between said first and second charges, and feedback controlling an input bias on said first reference register means to said given fraction of said first maximum charge amount, thereby feedback controlling the input bias on said signal register means to substantially the same charge level as that on said first reference register means.

2. A charge coupled device as set forth in claim 1, wherein said first and third signal inputs comprise input gates and said second and fourth signal inputs comprise source regions.

3. A charge coupled device as set forth in claim 1, wherein said first and third signal inputs comprise source regions and said second and fourth signal inputs comprise input gates.

4. A charge coupled device as set forth in claim 1, wherein said signal register means has an input section of substantially the same structure as said input section of said first reference register means.

5. A charge coupled device as set forth in claim 4, wherein said second reference register means has an output section of substantially the same structure as said output section of said first reference register means.

6. A charge coupled device as set forth in claim 5, wherein said second reference register means has an input section of substantially the same structure as said input section of said first reference register means except for that said input section of said reference register means has a narrower channel than said input section of said first reference register means, which narrower channel defines said second maximum charge amount.

7. A charge coupled device as set forth in claim 6, wherein said signal register means and said first and second reference register means have charge transfer channels oriented in a parallel relationship to each other and share a common substrate and at least one common transfer electrode.

8. A charge coupled device as set forth in claim 1, wherein said second reference register means has first and second input sections having mutually different handling charge and an output section common to said first and second input sections, said first and second input sections being adapted to selectively transfer charge.

9. A charge coupled device as set forth in claim 8, which further comprises means for selectively supplying predetermined magnitude of voltage signal to one of said first and second input section of said second reference register means for transferring charge through one of said first and second input sections.

10. A charge coupled device with automatic adjustment of an input bias, comprising:

a signal register means adapted to transfer input electric charge, said signal register means having first and second mutually separated signal inputs;

a first reference register means adapted to transfer electric charges from its input section to its output section, said first reference register means having a first maximum charge amount, said input section having third and fourth mutually separated signal inputs, said third signal input being connected to a constant voltage source, said fourth signal input connected to said second signal input of said signal register means;

a second reference register means constantly supplied with a voltage substantially corresponding to a second maximum charge amount of said second reference register, said second maximum charge amount being a given fraction of said first maximum charge amount;

an information signal source connected to said first signal input of said signal register; and a feedback circuit means having its output connected to said second and said fourth signal inputs for comparing a first charge transferred through said first reference register and a second charge transferred through said second reference register, deriving a feedback signal at its output having a value corresponding to the difference between said first and second charges, and feedback controlling an input bias on said first reference register to said given fraction of said first maximum charge amount, thereby feedback controlling the input bias on said signal register to substantially the same charge level as that on said first reference register, wherein said second reference register has first and second input sections having mutually different charge handling capacity and an output section common to said first and second input sections, said first and second input sections being adapted to selectively transfer charge.

11. A charge coupled device as set forth in claim 10, which further comprises means for selectively supplying a predetermined magnitude of voltage signal to one of first and second input sections of said second reference register means for transferring charge through one of said first and second input sections.

12. A charge coupled device as set forth in claim 10, wherein said first and third signal inputs comprise input gates and said second and fourth signal inputs comprise source regions.

13. A charge coupled device as set forth in claim 10, wherein said first and third signal inputs comprise source regions and said second and fourth signal inputs comprise input gates.

14. A charge coupled device as set forth in claim 10, wherein said signal register means has an input section of substantially the same structure as said input section of said first reference register means.

15. A charge coupled device as set forth in claim 14, wherein said second reference register means has an output section of substantially the same structure as said output section of said first reference register means.

16. A charge coupled device as set forth in claim 15, wherein said second reference register means has an input section of substantially the same structure as said input section of said first reference register means except that said input section of said reference register means has a narrower channel that said input section of said first reference register means, which narrower channel defines said second maximum charge amount.

17. A charge coupled device as set forth in claim 16, wherein said signal register means and said first and second reference register means have charge transfer channels oriented in a parallel relationship to each other and share a common substrate and at least one common transfer electrode.

* * * * *